(12) United States Patent
Wright

(10) Patent No.: US 8,773,218 B2
(45) Date of Patent: Jul. 8, 2014

(54) LADDER QUADRATURE HYBRID

(75) Inventor: Peter V. Wright, Portland, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 423 days.

(21) Appl. No.: 13/022,402

(22) Filed: Feb. 7, 2011

(65) Prior Publication Data

US 2012/0200370 A1     Aug. 9, 2012

(51) Int. Cl.
*H01P 5/12* (2006.01)
*H03H 7/38* (2006.01)

(52) U.S. Cl.
USPC .......................................... 333/117; 333/112

(58) Field of Classification Search
USPC ................ 333/109, 110, 112, 116, 117, 118
See application file for complete search history.

(56) References Cited

U.S. PATENT DOCUMENTS

| | | | |
|---|---|---|---|
| 1,604,981 A | | 11/1926 | Bell et al. |
| 4,893,098 A | * | 1/1990 | Seely et al. ................. 333/112 |
| 4,951,009 A | | 8/1990 | Collins |
| 5,132,645 A | | 7/1992 | Mayer |
| 5,410,743 A | * | 4/1995 | Seely et al. ................. 455/326 |
| 6,353,360 B1 | | 3/2002 | Hau et al. |
| 6,496,061 B1 | | 12/2002 | Bloom et al. |
| 6,515,541 B2 | | 2/2003 | Cheng et al. |
| 6,806,768 B2 | | 10/2004 | Klaren et al. |
| 6,954,623 B2 | | 10/2005 | Chang et al. |
| 7,030,717 B2 | | 4/2006 | Chung |
| 7,071,792 B2 | | 7/2006 | Meck |
| 7,486,134 B2 | | 2/2009 | Chang et al. |
| 7,486,136 B2 | | 2/2009 | Bakalski et al. |
| 7,542,740 B1 | | 6/2009 | Granger-Jones |
| 7,570,932 B1 | | 8/2009 | Folkmann |
| 7,592,881 B2 | | 9/2009 | Salomon |
| 7,598,827 B2 | | 10/2009 | Stuebing et al. |
| 2004/0235435 A1 | | 11/2004 | Barabash |
| 2005/0052259 A1 | | 3/2005 | Okazaki |
| 2006/0132232 A1 | | 6/2006 | Baree |
| 2006/0290444 A1 | | 12/2006 | Chen |
| 2009/0195317 A1 | | 8/2009 | Zhang |

OTHER PUBLICATIONS

Hou, Jian-An, et al; "A Compact Quadrature Hybrid Based on High-Pass and Low-Pass Lumped Elements;" IEEE Microwave and Wireless Components Letters, vol. 17, No. 8, Aug. 2007.
Hou, Jian-An, et al; "Design and Analysis of Novel Quadrature Hybrids with Compact Lumped Elements;" Institute of Microelectronics & Department of Electrical Engineering, National Cheng-Kung University; Dec. 16-19, 2009.
U.S. Appl. No. 12/559,372; Non-Final Office Action dated Jul. 12, 2012.
U.S. Appl. No. 12/559,372; Non-Final Office Action dated Jan. 28, 2013.
U.S. Appl. No. 12/559,372; Notice of Allowance dated Apr. 15, 2013.
U.S. Appl. No. 13/070,424; Non-Final Office Action dated Jul. 31, 2013.

\* cited by examiner

*Primary Examiner* — Dean O Takaoka
(74) *Attorney, Agent, or Firm* — Schwabe Williamson & Wyatt

(57) ABSTRACT

Embodiments of circuits, apparatuses, and systems for a quadrature hybrid circuit are disclosed. The quadrature hybrid circuit may include a ladder structure, may act as a combiner or a divider, and may transform a source impedance to a load impedance.

20 Claims, 18 Drawing Sheets

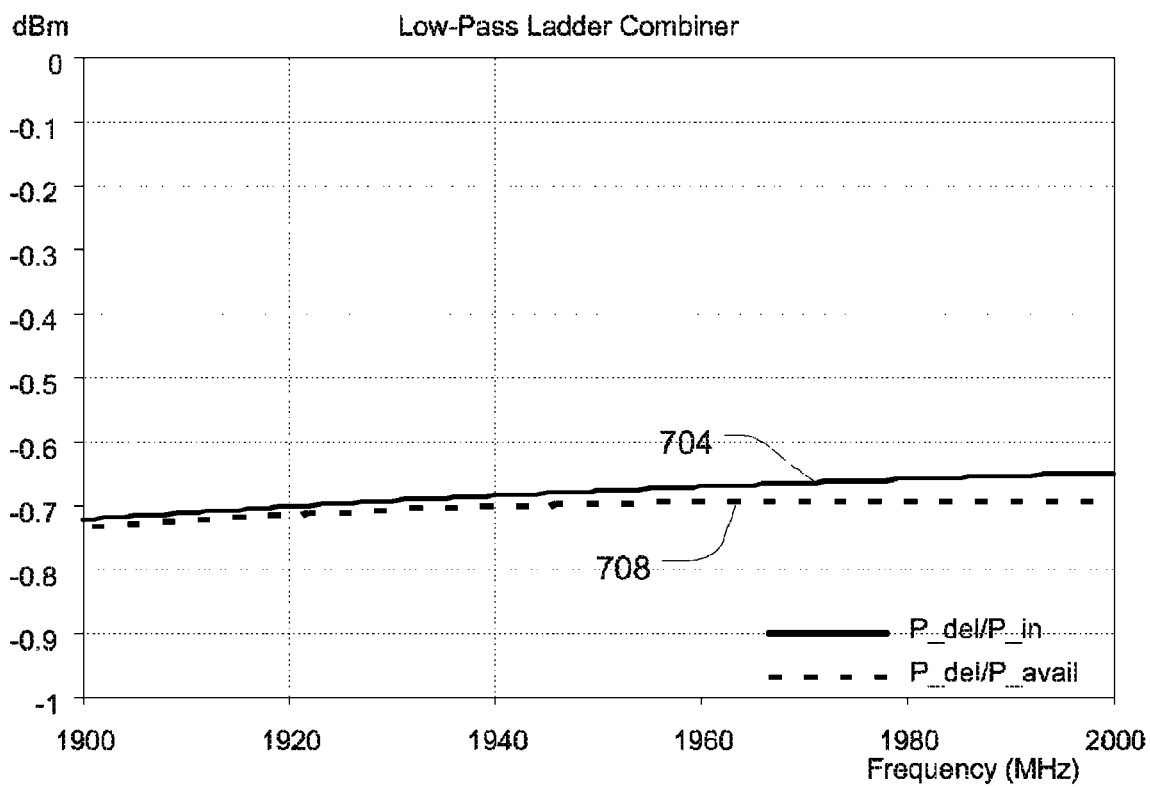
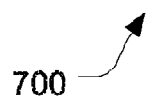
Figure 7

US 8,773,218 B2

LADDER QUADRATURE HYBRID

FIELD

Embodiments of the present disclosure relate generally to the field of circuits, and more particularly to a ladder quadrature hybrid.

BACKGROUND

A four-port quadrature hybrid can be used to combine two input signals having a 90° phase difference into a single output (quadrature combiner). Conversely, it can be used to split an input signal into two output signals with a 90° phase difference (quadrature divider). For the quadrature combiner, ideally the two input ports are isolated from one another, and any reflected energy from the load is terminated in a fourth, uncoupled port. Thus, assuming input signals are in quadrature (i.e., have a 90° phase difference) and are of equal magnitude, the four-port quadrature hybrid will provide a desirable match at the output port.

A branchline circuit is a type of four-port quadrature hybrid that is capable of providing an impedance transformation. A branchline circuit may include two parallel transmission lines and two shunt transmission lines. Each of the transmission lines may be replaced with its lumped element equivalent. A branchline divider, with inductors having a Q-factor of 20 and capacitors having an equivalent series resistance of 0.20 ohms, which are typical values for elements of a gallium arsenide die, may transform a 40 ohm input resistance to two 13.9 ohm output resistances with branchline losses of approximately 1.5 dB, due mostly to dissipation.

A ladder circuit is another type of four-port quadrature hybrid that was developed to eliminate the need for through-hole silicon vias, which are required for the lumped-element equivalent circuits in a branchline combiner. While the ladder circuit performs a quadrature combining/dividing with less insertion loss as compared to the branchline circuit (approximately 1 dB less), it does not provide any impedance transformation.

BRIEF DESCRIPTION OF THE DRAWINGS

Embodiments are illustrated by way of example and not by way of limitation in the figures of the accompanying drawings, in which like references indicate similar elements and in which:

FIG. 7 is a chart that plots insertion loss as a function of frequency in accordance with some embodiments of the present disclosure.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Figure 1:
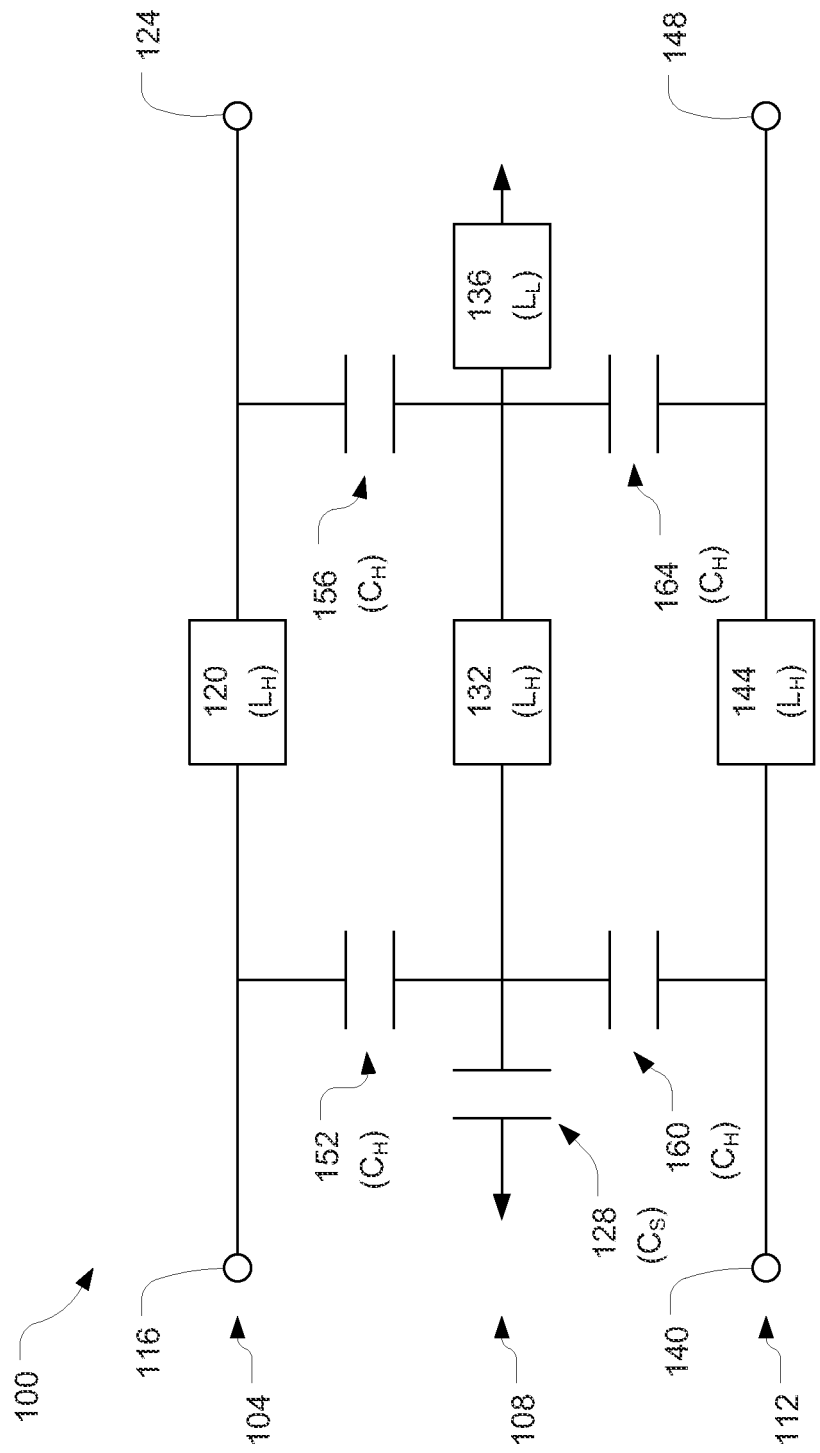
FIG. 1 illustrates a quadrature hybrid circuit in accordance with some embodiments of the present disclosure.

FIG. 1 illustrates a quadrature hybrid circuit 100 in accordance with some embodiments of the present disclosure. The quadrature hybrid circuit 100, which may be referred to as circuit 100, includes rungs 104, 108, and 112. Rung 104 includes port 116, inductor 120, and port 124. Rung 108 includes capacitor 128, inductor 132, and inductor 136. Rung 112 includes port 140, inductor 144, and port 148.

The rungs of the circuit 100 may be intercoupled by a number of capacitors. In particular, capacitors 152 and 156 are coupled with and between rungs 104 and 108; and capacitors 160 and 164 are coupled with and between rungs 108 and 112. As used herein, capacitors and inductors may be generically referred to as passive electrical components.

Relative values of the passive electrical components may be designated by the descriptors in parentheses of FIG. 1. For example, inductors 120, 132, and 144 may all have an inductance of $L_H$; capacitors 152, 156, 160, and 164 may all have a capacitance of $C_H$; capacitor 128 may have a capacitance of $C_S$; and inductor 136 may have an inductance of $L_L$.

The circuit 100 provides impedance-transformation capabilities similar to a branchline circuit and low insertion-loss characteristics similar to a conventional ladder circuit. As will be explained in further detail, these impedance transformation capabilities and low insertion-loss characteristics are at least partially enabled by the input and output reactances respectively provided by capacitor 128 and inductor 136. An understanding of the operation of the circuit 100 may be achieved by characterizing and attributing coupler losses through a branchline circuit and a ladder circuit.

A four-port, lumped-element, branchline circuit with top and bottom symmetry may be analyzed using even/odd mode excitation. Reflection coefficients for ports 1 and 2 are Γ=Γ_e+Γ_o. Ports 1 and 2 may be the top ports, which would respectively correspond to ports 116 and 124 of circuit 100. The reflection coefficients for ports 3 and 4 are Γ=Γ_e−Γ_o. Ports 3 and 4 may be the bottom ports, which would respectively correspond to ports 148 and 140 of circuit 100. A solution of these two equations is Γ_e=Γ_o=0. Excitations for even-mode analysis may be +V/2 at port 1 and +V/2 at port 4. Excitations for odd-mode analysis may be +V/2 at port 1 and −V/2 at port 4.

If even-mode phase shift=0, and odd-mode phase shift=0+ Δ, where Δ is phase shift at ports 1 and 4, then $$\frac{V_2}{V_3} = j\frac{\sin\Delta}{1-\cos\Delta}, \quad \text{Equation 1}$$

where $V_2$ is voltage at port 2, $V_3$ is voltage at port 3, and j denotes the imaginary number, i.e., √−1. When Δ32 90°, Equation 1 reduces to $V_2$=j$V_3$, which may represent an equal power split when j=1.

Figures 2A, 2B:
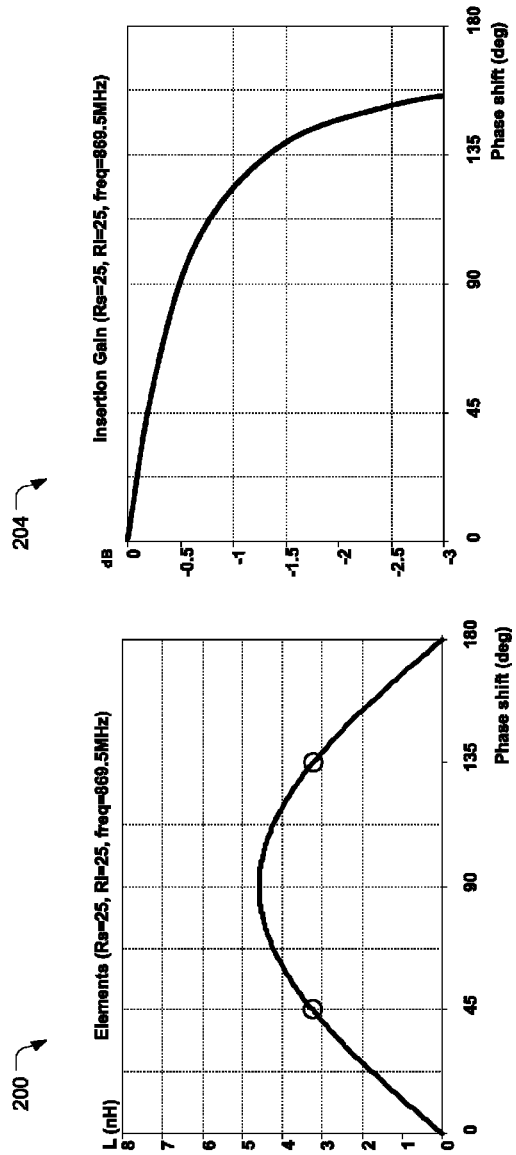
FIG. 2a is a chart that plots series inductance as a function of phase.
FIG. 2b is a chart that plots insertion loss as a function of phase shift.

If the branchline circuit includes lumped elements as a low-pass pi network, with a series inductor and two shunt capacitors, the series inductance remains the same during both even- and odd-mode excitations. Referring to FIG. 2a, which is a chart 200 that plots series inductance as a function of phase for a source impedance ($R_S$) and load impedance ($R_L$) of 25 ohms and a frequency of 869.5 megahertz (MHz), it may be seen that insertion phases of 45° and 135°, circled, are used to accommodate a 90° phase shift with a constant inductance. Referring to FIG. 2b, which is a chart 204 that plots insertion loss as a function of phase shift for similar $R_S$, $R_L$, and frequency as FIG. 2a, it may be seen that, for finite Q-factor elements, higher phase shifts result in higher insertion losses. While a 45° phase shift may be associated with a relatively low insertion loss, a 135° phase shift may be associated with a more significant insertion loss. This relationship between phase shift and insertion loss may be attributable to increased shunt susceptance required for greater phase shift, and the series resistance of an inductor being in a low impedance environment.

If the branchline circuit has inductors with a Q-factor of 20 and capacitors with an equivalent series resistance (ESR) of 0.20 ohms, an insertion loss in the odd mode, with the phase shift of −45°, may be approximately 1.42 dB, while an insertion loss in the even mode, with the phase shift of −135°, may be approximately 1.36 dB. While one may expect a lower phase shift to have a lower loss as previously described, a higher loss at the 45° phase shift results from resonance of shunt elements. Thus, both even and odd modes of such a branchline circuit may experience significant insertion losses.

Performing an even/odd mode analysis on a ladder circuit may clarify why ladder circuits are associated with lower insertion losses as compared to branchline circuits. Consider, for example, a circuit such as circuit 100, without capacitor 128 and inductor 136. In an odd mode, with +V/2 applied to port 1 and −V/2 applied to port 3, short circuits may result at intermediate nodes, thereby dividing the ladder circuit into two pi circuits, for example, circuit 300 shown in FIG. 3a. As shown by line 304 in FIG. 3a, current will flow through an inductor 308. Assuming the inductor 308 has a Q-factor of 20 and capacitors 312 and 316 have ESRs of 0.20 ohms, a phase shift of −90° in the odd mode will result in an insertion loss of approximately 0.49 dB.

Figure 3B:
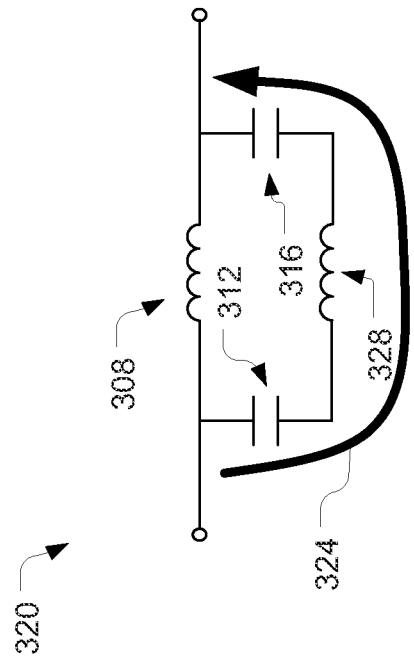
FIGS. 3a-3b illustrate current flows through various circuits in an even/odd mode analysis.
Figure 3A:
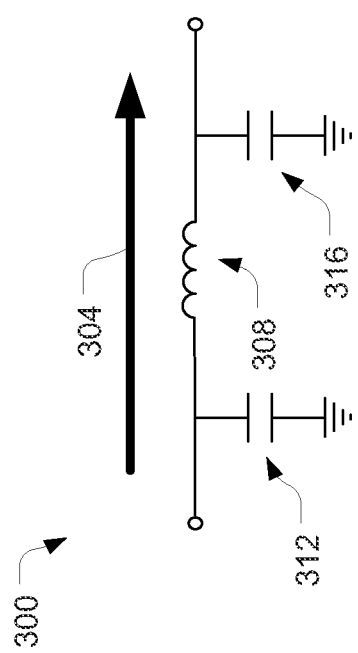

In an even mode, with +V/2 applied to both ports 1 and 3, a resultant equivalent circuit 320, as shown in FIG. 3b, may result. In the even mode, the inductors and capacitors may be complex conjugates of one another. This may result in the current path shown by line 324, through capacitor 312, inductor 328, and capacitor 316, having series resonance and no resistance, thereby shorting the segment with the inductor 308. Assuming inductors of the first, second, and third rungs have an inductance of L, the inductor 328 will have an inductance of 2 L. A 0° phase shift in the even mode may result in an insertion loss of approximately 0.48 dB.

As can be seen, a ladder circuit may have an inherently lower loss than a branchline circuit. However, due at least in part to the short circuit that results in the even mode, conventional ladder circuits do not have an impedance transformation capability. That is, the source impedance will equal the load impedance. Addition of midpoint reactances, provided by capacitor 128 and inductor 136 of circuit 100, may enable impedance transformation through the circuit 100.

The circuit 100 may transform a relatively high source impedance to a relatively low load impedance. The positions of the capacitor 128 and the inductor 136 may be switched in an embodiment in which an opposite impedance transformation is desired. The circuit 100 may be a low-pass network that passes low-frequency signals and attenuates signals with frequencies above a threshold frequency.

Figures 4A, 4B:
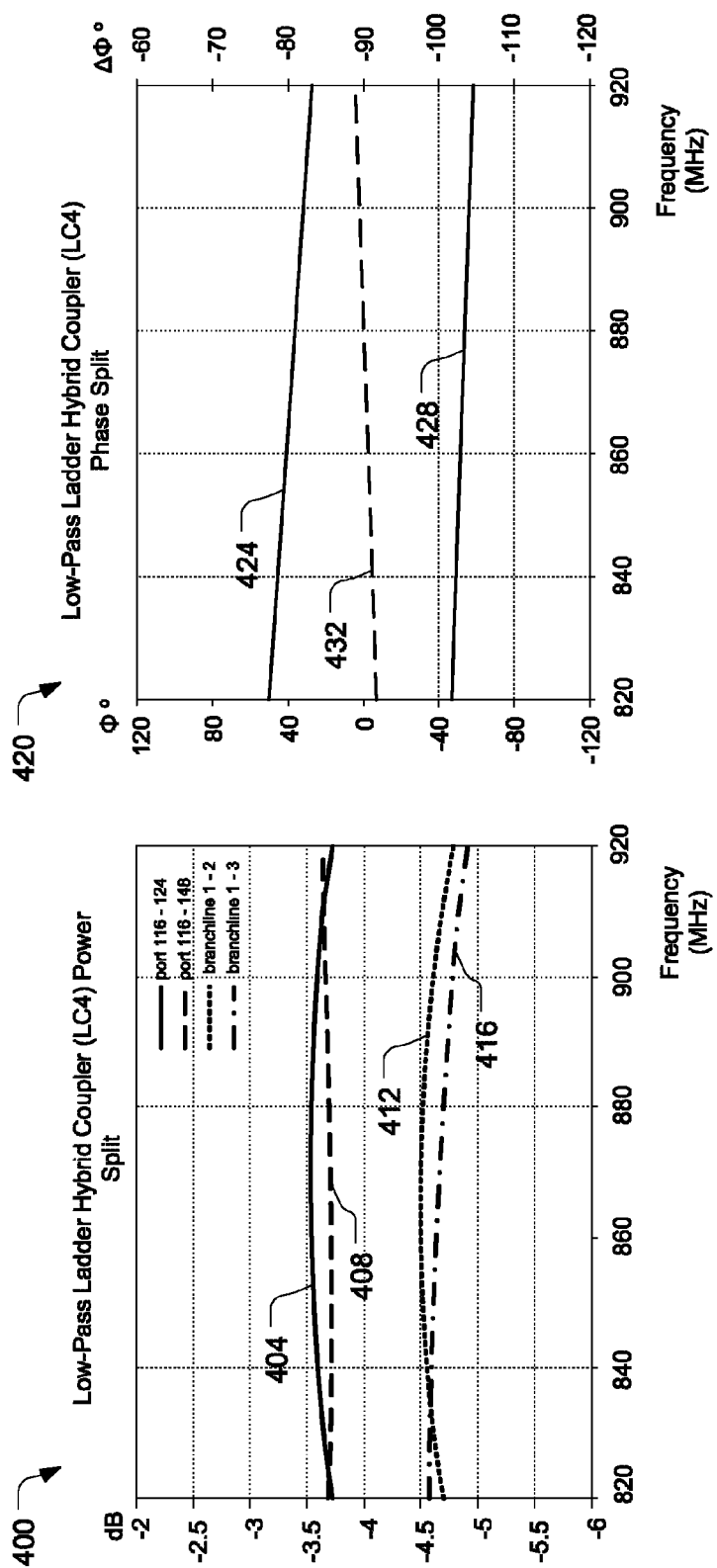
FIG. 4a is a chart that plots insertion loss as a function of frequency in accordance with some embodiments of the present disclosure.
FIG. 4b is a chart that plots phase angle and change of phase angle as functions of frequency in accordance with some embodiments of the present disclosure.

FIG. 4a is a chart 400 that plots insertion loss as a function of frequency in accordance with some embodiments. Lines 404 and 408 represent insertion loss through circuit 100 given the following parameters: inductors having Q-factor=20; capacitors having ESR=0.2 ohms; inductors 120, 132, and 144 having an inductance=4.49 nanohenries (nH), capacitors 152, 156, 160 and 164 having capacitance=8.08 picoFarads (pF); capacitor 128 having capacitance=5.63 pF; inductor 136 having an inductance=10.95 nH; $R_S$=40 ohm; and $R_L$=13.9 ohm. The specific parameters, used here and elsewhere, are meant for illustration purposes and do not restrict other embodiments from having other parameters.

The circuit 100 may be used as a power divider in this embodiment, with input signal power received at port 116 being split between ports 124 and 148, and the port 140 may be used as an isolating port. Line 404 may represent path from port 116 to port 124; line 408 may represent path from port 116 to port 148; and line 412 may represent path from port 1 to port 2 of a branchline circuit; and line 416 may represent path from port 1 to port 3 of a branchline circuit.

As can be seen, circuit 100 may have an in-band insertion loss that is approximately 1 dB less than an insertion loss of the branchline circuit. Furthermore, the circuit 100 may perform an impedance transformation with only a marginal increase in insertion loss, for example less than 0.2 dB, as compared to a non-impedance transforming ladder circuit.

FIG. 4b is a chart 420 that plots phase angle ($\phi°$) and change of phase angle ($\Delta\phi°$) as functions of frequency. Line 424 plots the transmission phase, with reference to the left axis, from port 116 to port 124. Line 428 plots the transmission phase, with reference to the left axis, from port 116 to port 148. Line 432 plots the difference in transmission phase between lines 424 and 428. It can be seen that line 432 is close to the desired value of 90° relative phase shift across the frequency band.

Figure 5:
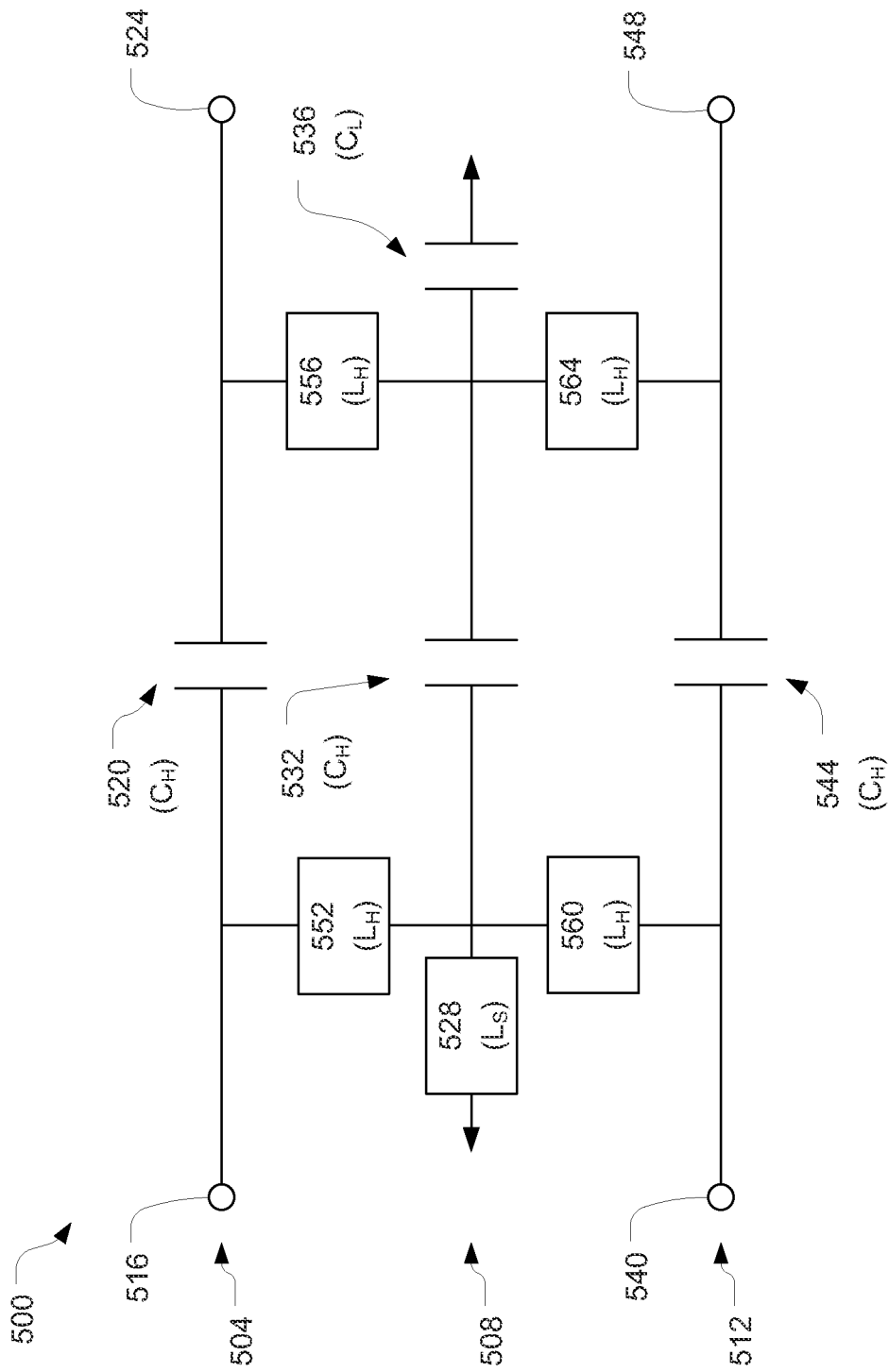
FIG. 5 illustrates a quadrature hybrid circuit in accordance with some embodiments of the present disclosure.

FIG. 5 illustrates a quadrature hybrid circuit 500 in accordance with some embodiments of the present disclosure. The quadrature hybrid circuit 500, which may be referred to as circuit 500, includes rungs 504, 508, and 512. Rung 504 includes port 516, capacitor 520, and port 524. Rung 508 includes an inductor 528, a capacitor 532, and a capacitor 536. Rung 512 includes port 540, capacitor 544, and port 548.

The rungs of the circuit 500 may be intercoupled by a number of inductors. In particular, inductors 552 and 556 are coupled with and between rungs 504 and 508; and inductors 560 and 564 are coupled with and between rungs 508 and 512.

The circuit 500 may provide impedance transformation capabilities and low insertion loss characteristics similar to circuit 100. However, circuit 500 may be a high-pass network that passes high-frequency signals and attenuates signals with frequencies below a threshold frequency. As shown, the circuit 500 may transform a relatively high impedance to a relatively low impedance. The positions of the inductor 528 and capacitor 536 may be switched in an embodiment in which an opposite impedance transformation is desired.

Figure 6:
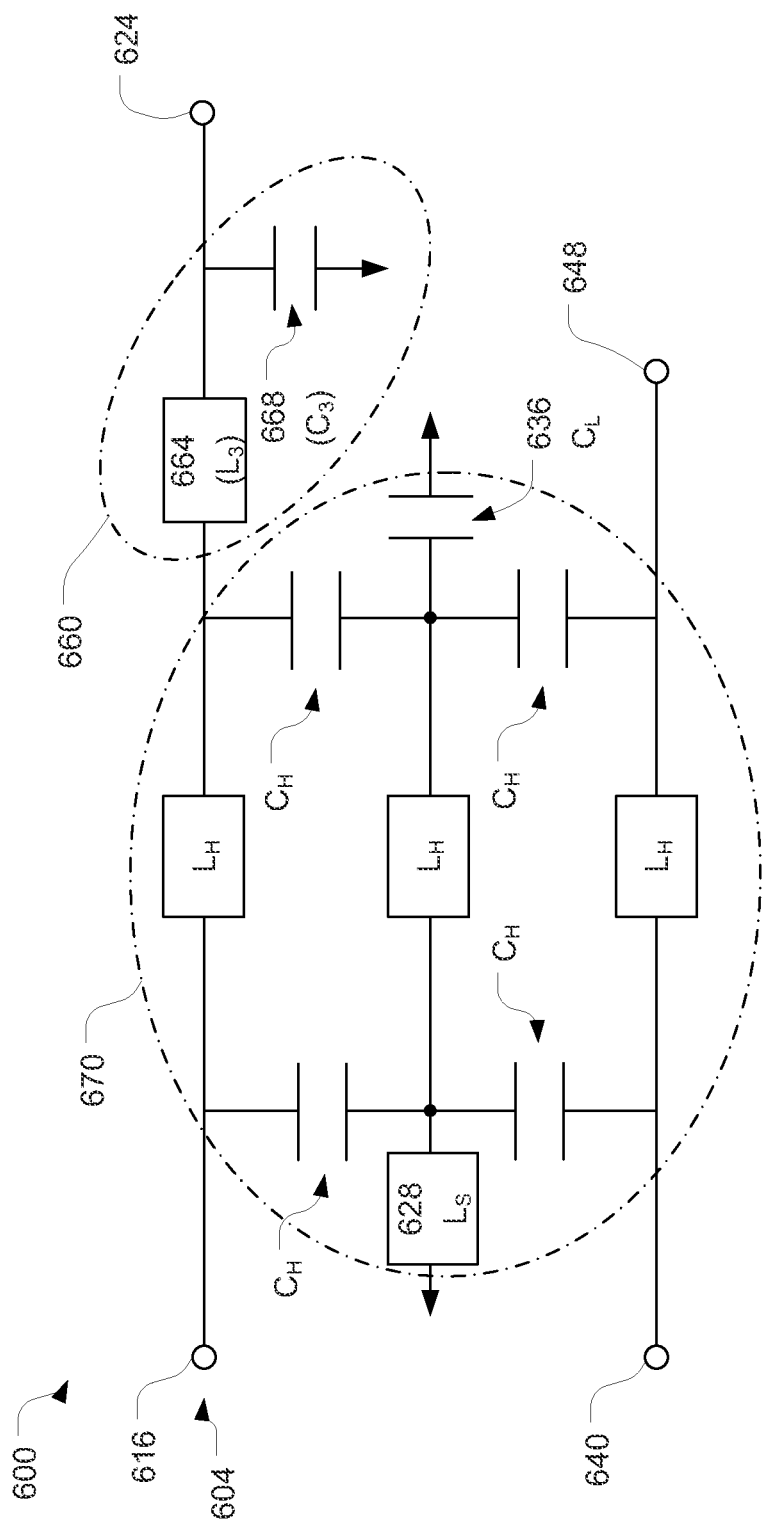
FIG. 6 illustrates a quadrature hybrid circuit in accordance with some embodiments of the present disclosure.

FIG. 6 illustrates a quadrature hybrid circuit 600 in accordance with some embodiments of the present disclosure. The quadrature hybrid circuit 600, which may be referred to as circuit 600, may be a low-pass network that is similar to circuit 100 with the exception of the following differences. First, circuit 600 may have inductor 628 located at an input midpoint and capacitor 636 located at an output midpoint, to transform a relatively low source impedance to a relatively high source impedance. Second, circuit 600 may include an additional match circuit 660. The match circuit 660 may be coupled with a first rung 604 of the circuit 600 and may include a series inductor 664 and a shunt capacitor 668. The additional match circuit 660 may provide the circuit 600 with additional impedance-transformation flexibility.

The inductor 664 and the capacitor 668 may effect a low-pass match external to a coupler portion 670 of the circuit 600.

In other embodiments, the inductor 664 and the capacitor 668 could be interchanged to effect a high-pass match external to the coupler portion 670.

FIG. 7 is a chart 700 that plots insertion loss as a function of frequency in accordance with some embodiments of this disclosure. Lines 704 and 708 represent power ratios of the circuit 600 when acting as a combiner, i.e., input signal powers at ports 616 and 640 being combined into output signal power at port 624, and the port 648 acting as an isolation port. The chart 700 may represent the following parameters of circuit 600: inductors having a Q-factor=30; capacitors having an ESR=0.2 ohms; $R_S$ (at ports 616 and 640)=8 ohms; $R_L$ (at port 624)=50 ohms; and an isolation impedance (at port 648)=25 ohms. In particular, the power ratio represented by line 704 is a ratio of delivered power (P_del) to input power (P_in); and the power ratio represented by line 708 is a ratio of P_del to available power (P_avail).

Figure 8:
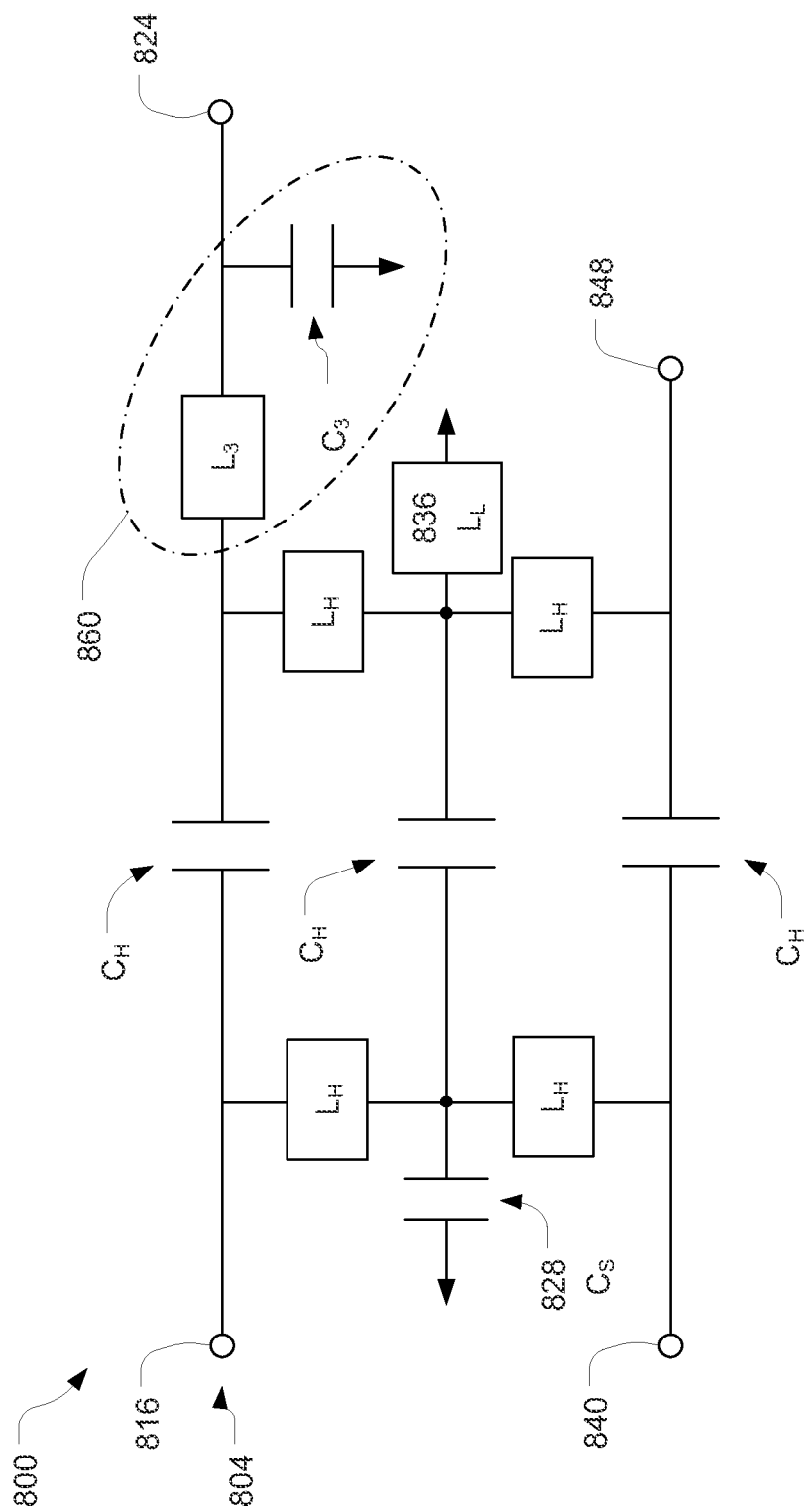
FIG. 8 illustrates a quadrature hybrid circuit in accordance with some embodiments of the present disclosure

FIG. 8 illustrates a quadrature hybrid circuit 800 in accordance with some embodiments of the present disclosure. The quadrature hybrid circuit 800, which may be referred to as circuit 800, may have an additional match circuit 860 coupled to a first rung 804, similar to match circuit 660. However, contrary to circuit 600, circuit 800 may be a high-pass circuit, similar to circuit 500. Further contrary to circuit 600, circuit 800 may perform a relatively high- to low-impedance transformation, similar to circuit 100, given positions of capacitor 828 and inductor 836 at respective input and output midpoints.

Figure 9:
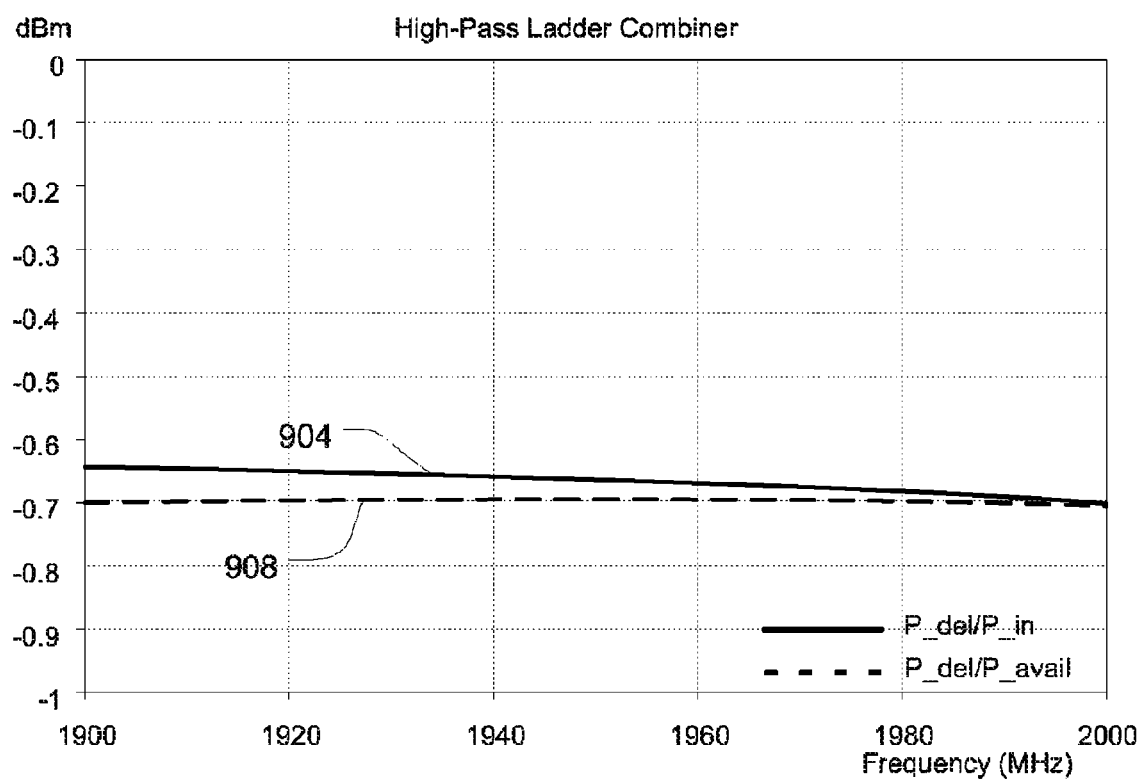
FIG. 9 is a chart that plots insertion loss as a function of frequency in accordance with some embodiments of the present disclosure.

FIG. 9 is a chart 900 that plots insertion loss as a function of frequency in accordance with some embodiments of this disclosure. Lines 904 and 908 represent power ratios of the circuit 800 when acting as a combiner, i.e., input signal powers at ports 816 and 840 being combined into output signal power at port 824, and the port 848 acting as an isolation port. The chart 900 may represent the following parameters of circuit 800: inductors having a Q-factor=30; capacitors having an ESR=0.2 ohms; $R_S$ (at ports 816 and 840)=8 ohms; $R_L$ (at port 824)=50 ohms; and an isolation impedance (at port 848)=25 ohms. In particular, the power ratio represented by line 904 is a ratio of P_del to P_in; and the power ratio represented by line 908 is a ratio of P_del to P_avail.

Figure 10:
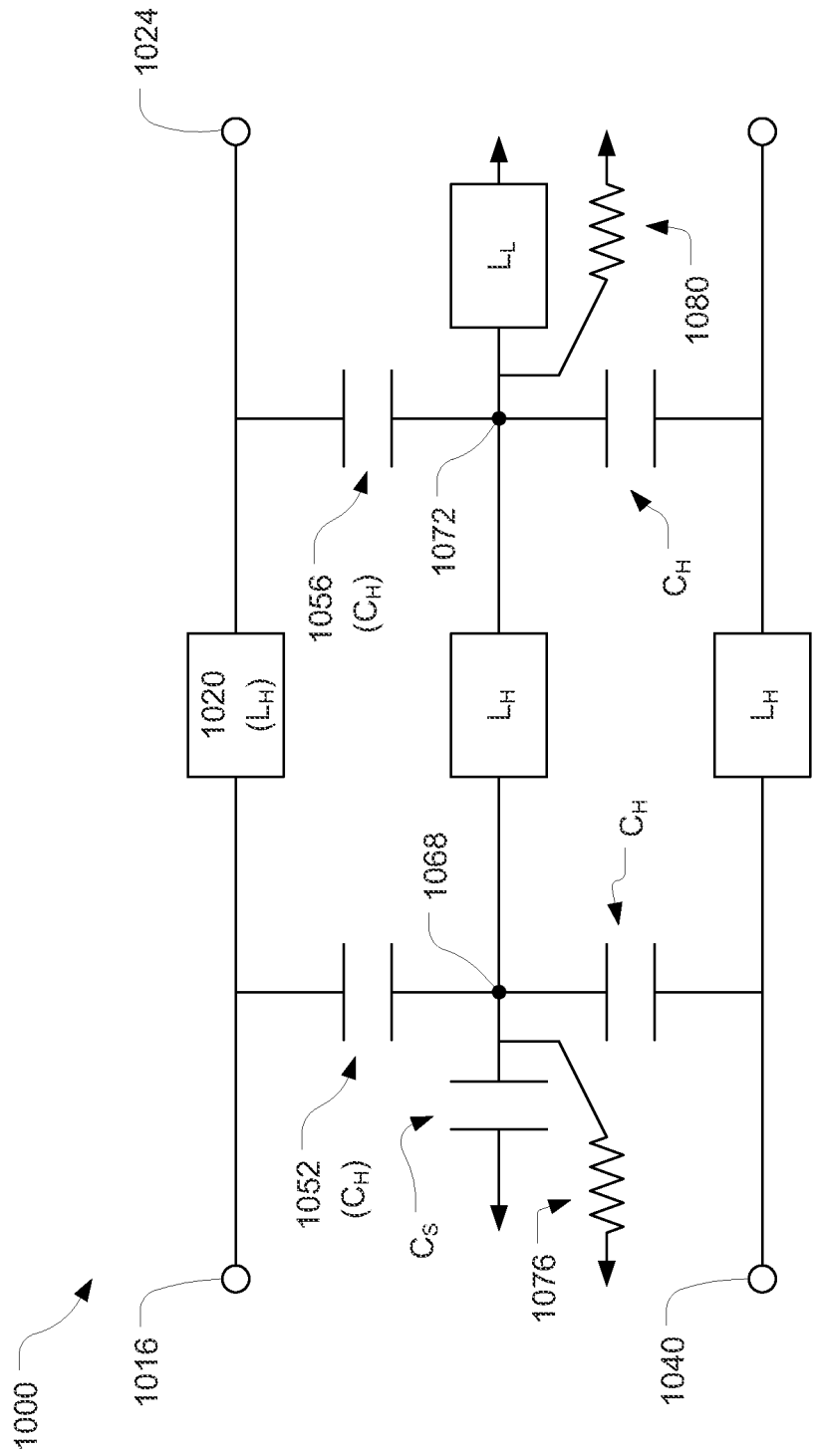
FIG. 10 illustrates a quadrature hybrid circuit in accordance with some embodiments of the present disclosure.

Embodiments of the present disclosure may have a high degree of symmetry that can be exploited for high-efficiency, backoff-power configurations. Consider, for example, a quadrature hybrid circuit 1000 shown in FIG. 10 in accordance with some embodiments. The quadrature hybrid circuit 1000, which may also be referred to as circuit 1000, may be similar to circuit 100, except circuit 1000 may include switches 1076 and 1080 coupled with points 1068 and 1072, respectively.

Switches described herein, e.g., switches 1076 and 1080, may be of any suitable technology. For example, switches may be, but are not limited to, pseudomorphic high electron mobility transistor (pHEMT) switches, silicon switches, and/or micro-electromechanical system (MEMS) switches.

Figure 11:
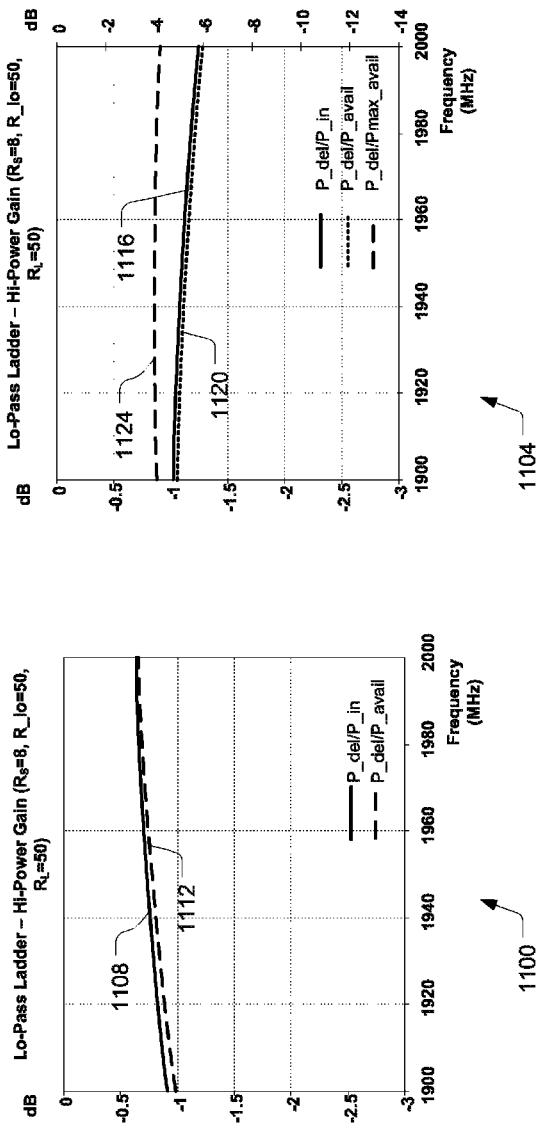
FIGS. 11a-11b are charts that plot insertion losses as a function of frequency in accordance with some embodiments of the present disclosure.

FIGS. 11a and 11b respectively show charts 1100 and 1104 that plot insertion losses as a function of frequency in accordance with some embodiments of this disclosure. Charts 1100 and 1104 may correspond to the circuit 1000 operating as a combiner in a full-power mode and a backoff-power mode, respectively, with the following parameters: inductors having a Q-factor=30; capacitors having an ESR=0.2 ohms; $R_S$ (on ports 1016 and 1040)=8 ohms; $R_L$ (on port 1024)=50 ohms; and the design impedance, R_lo, (for port 1024)=50 ohms. It may be noted that the R_lo may not be equal to $R_L$ in an embodiment in which an additional match circuit is provided on the output port, e.g., as is done in circuit 600.

Lines 1108 and 1112 of chart 1100 represent various power ratios through circuit 1000 while in full-power mode, which may occur when both switches 1076 and 1080 are opened. In particular, line 1108 represents a ratio of P_del to P_in, and line 1112 of chart 1100 represents a ratio of P_del to P_avail. With P_del being measured at port 1024, the highest insertion losses shown in chart 1100 may be −0.81 dB for P_del/P_in and −0.84 dB for P_del/P_avail.

Lines 1116, 1120, and 1124 of chart 1104 represent various power ratios through circuit 1000 while in a backoff-power mode, which may occur when both switches 1076 and 1080 are closed and a power amplifier coupled with the port 1040 is turned off, e.g., unbiased. In one embodiment, for example, a Global System for Mobile Communications (GSM) embodiment, a medium backoff mode may have a 3 dB backoff. Closing the switches 1076 and 1080 may result in a pi network that has capacitors 1052 and 1056 and inductor 1020.

Line 1116 of chart 1104 represents a ratio of P_del to P_in; line 1120 represents a ratio of P_del to P_avail; and line 1124 represents a ratio of P_del to maximum available power (Pmax_avail). The insertion loss of lines 1116 and 1120 may be shown with reference to the left side of chart 1104, while the insertion losses of line 1124 may be shown with reference to the right side of chart 1104. The highest insertion losses shown in chart 1104 may be −1.11 dB for P_del/P_in; −1.15 dB for P_del/P_avail; and −4.16 for P_del/Pmax_avail. Approximately 3 dB of the P_del/Pmax_avail value may be due to the power amplifier coupled with port 1040 being turned off, while some of the additional insertion loss in the backoff mode may be associated with the approximately 1 ohm impedance through the closed switches 1076 and 1080.

The insertion losses of the above embodiment compare favorably to insertion losses of a branchline circuit utilizing switches to effect a 3 dB backoff. Such a branchline circuit may have insertion losses of P_del/P_in=−2.18 dB; P_del/P_avail=−2.31 dB; and P_del/Pmax_avail=−5.32 dB. The higher losses associated with the branchline circuit may be a result of resonating elements.

Figure 12:
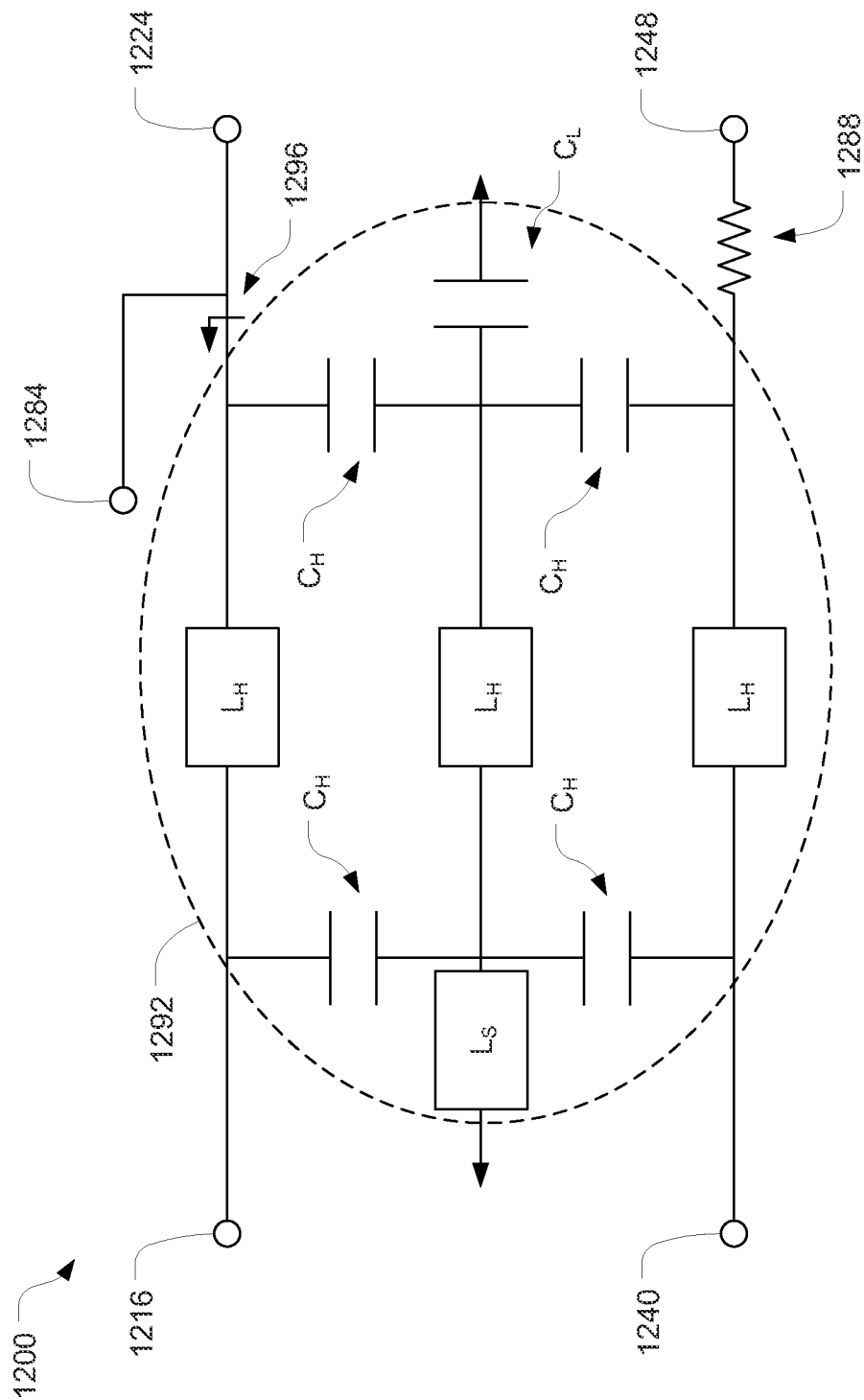
FIG. 12 illustrates a quadrature hybrid circuit in accordance with some embodiments of the present disclosure.

FIG. 12 illustrates a quadrature hybrid circuit 1200 in accordance with some embodiments. The quadrature hybrid circuit 1200, which may be referred to as circuit 1200, may be similar to circuit 600 except for the following noted differences. First, circuit 1200 is not shown with an additional match circuit such as match circuit 660 of circuit 600. However, in some embodiments an additional match circuit may be added to this or other circuits. Second, circuit 1200 may provide for a backup power mode by providing port 1284, which is configured to be coupled to a low-power amplifier, and switch 1288.

A high-power mode may occur when power amplifiers coupled with ports 1216 and 1240 are turned on, for example, biased; switch 1288 is closed; and power amplifier coupled with port 1284 is turned off, for example, unbiased. The backoff-power mode may have, e.g., an 11 dB backoff and may occur when power amplifiers coupled with ports 1216 and 1240 are turned off, for example, unbiased, switch 1288 is opened, and a power amplifier coupled with port 1284 is turned on, for example, biased. The elements within coupler portion 1292 may be self-resonant and form a tank circuit while the circuit 1200 is in a backoff-power mode. This may cause a high, for example, infinite, impedance at point 1296.

When the circuit 1200 is used as a combiner, little to no power is wasted through the switch, as the port 1248 will be operating as an isolation port.

Figure 13:
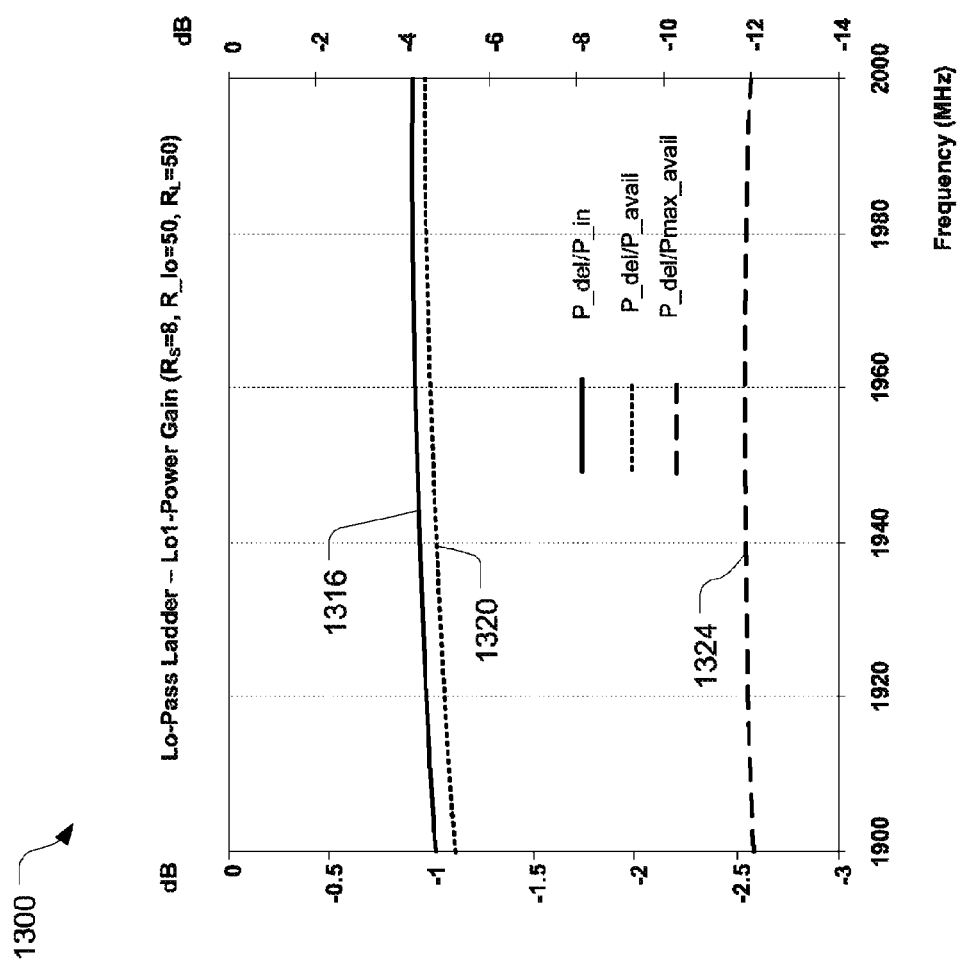
FIG. 13 illustrates a chart that represents various power ratios in accordance with some embodiments of the present disclosure.

FIG. 13 illustrates a chart 1300 that represents various power ratios through circuit 1200 having the following parameters: inductors having a Q-factor=30, capacitors having an ESR=0.2 ohms; $R_S$ (on ports 1216 and 1240)=8 ohms; and $R_L$ (on port 1224)=50 ohms.

Line 1316 of chart 1300 represents a ratio of P_del to P_in; line 1320 represents a ratio of P_del to P_avail; and line 1324 represents a ratio of P_del to Pmax_avail. Lines 1316 and 1320 represent insertion losses in full power mode and may be shown with reference to the left side of chart 1300, while line 1324 represents insertion loss in the backoff-power mode and may be shown with reference to the right side of chart 1300. The highest insertion losses shown in chart 1300 may be −0.97 dB for P_del/P_in; −1.04 dB for P_del/P_avail; and −12.00 for P_del/Pmax_avail.

Figure 14:
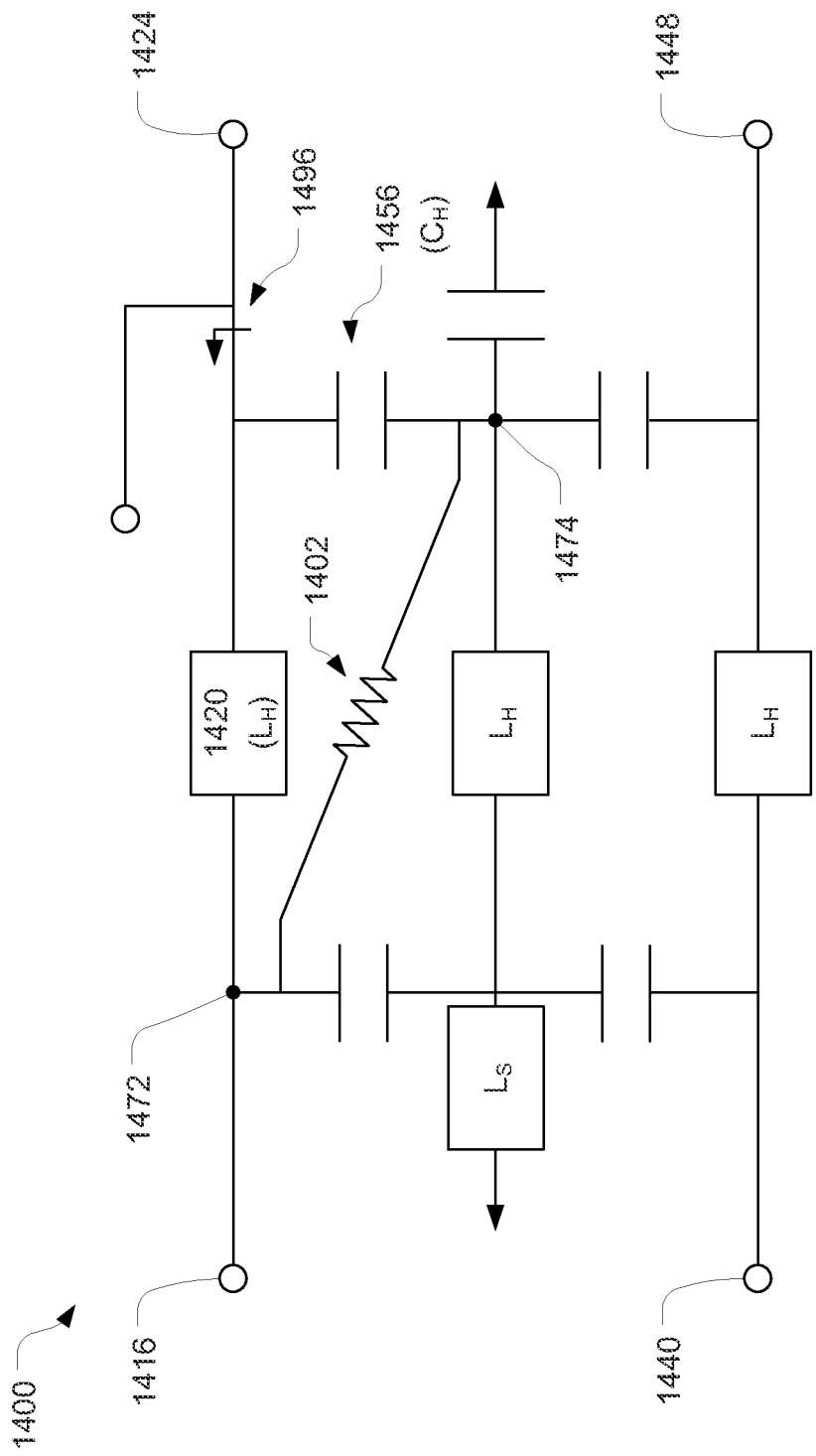
FIG. 14 illustrates a quadrature hybrid circuit in accordance with some embodiments of the present disclosure.

FIG. 14 illustrates a quadrature hybrid circuit 1400 in accordance with some embodiments. The quadrature hybrid circuit 1400, which may be referred to as circuit 1400, may be similar to circuit 1200; however, circuit 1400 may include switch 1402, coupled with points 1472 and 1474, and may not include a switch at port 1448. In this embodiment, the circuit 1400 may enter a backoff-power mode having, e.g., a 11 dB backoff, by turning off, for example, unbiasing, power amplifiers coupled with ports 1416 and 1440 and closing switch 1402. In this case, the inductor 1420 and capacitor 1456 will be self-resonant, causing a tank circuit with a high impedance at point 1496.

Figure 15:
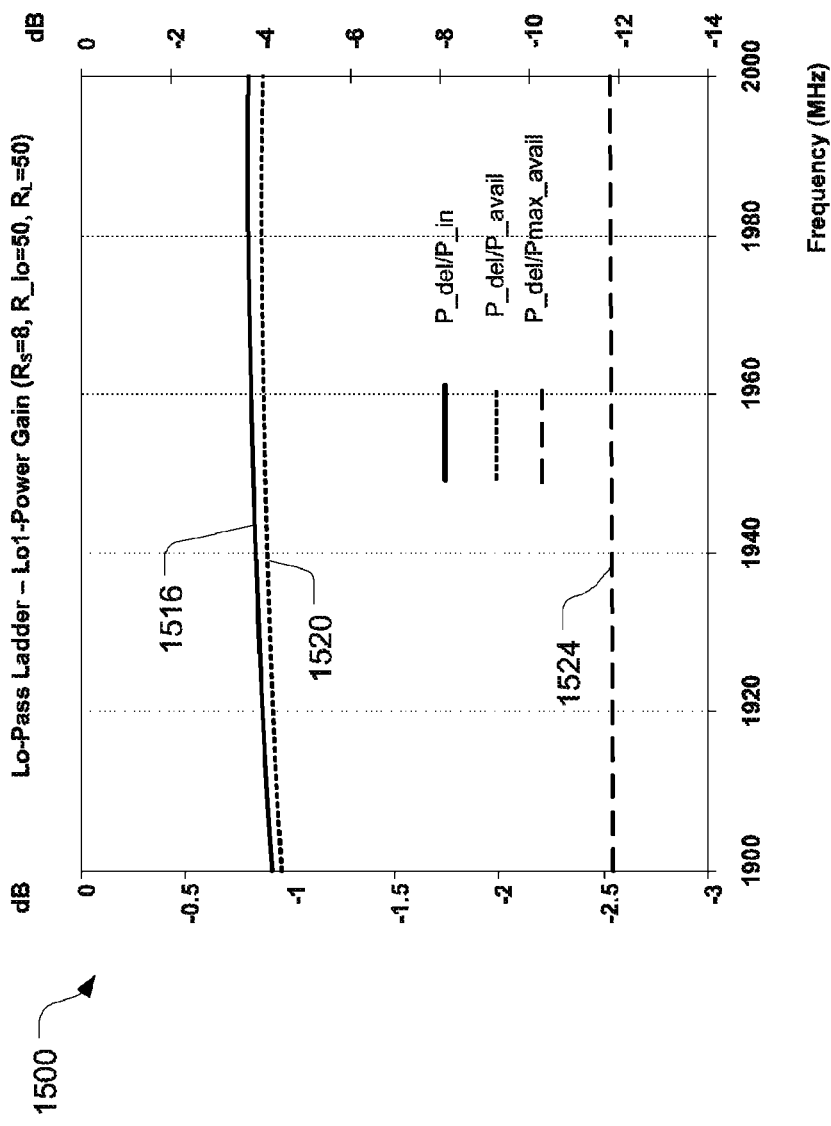
FIG. 15 illustrates a chart that represents various power ratios in accordance with some embodiments of the present disclosure.

FIG. 15 illustrates a chart 1500 that represents various power ratios through circuit 1400 while in a full- and backoff-power mode. The circuit 1400 may have the following parameters: inductors having a Q-factor=30, capacitors having an ESR=0.2 ohms; $R_S$ (on ports 1416 and 1440)=8 ohms; and $R_L$ (on port 1424)=50 ohms.

Line 1516 of chart 1500 represents a ratio of P_del to P_in; line 1520 represents a ratio of P_del to P_avail; and line 1524 represents a ratio of P_del to Pmax_avail. Lines 1516 and 1520 represent insertion losses in full-power mode and may be shown with reference to the left side of chart 1500, while line 1524 represents insertion loss in the backoff-power mode and may be shown with reference to the right side of chart 1500. The highest insertion losses shown in chart 1500 may be −0.86 dB for P_del/P_in; −0.90 dB for P_del/P_avail; and −11.87 for P_del/Pmax_avail.

Figure 16:
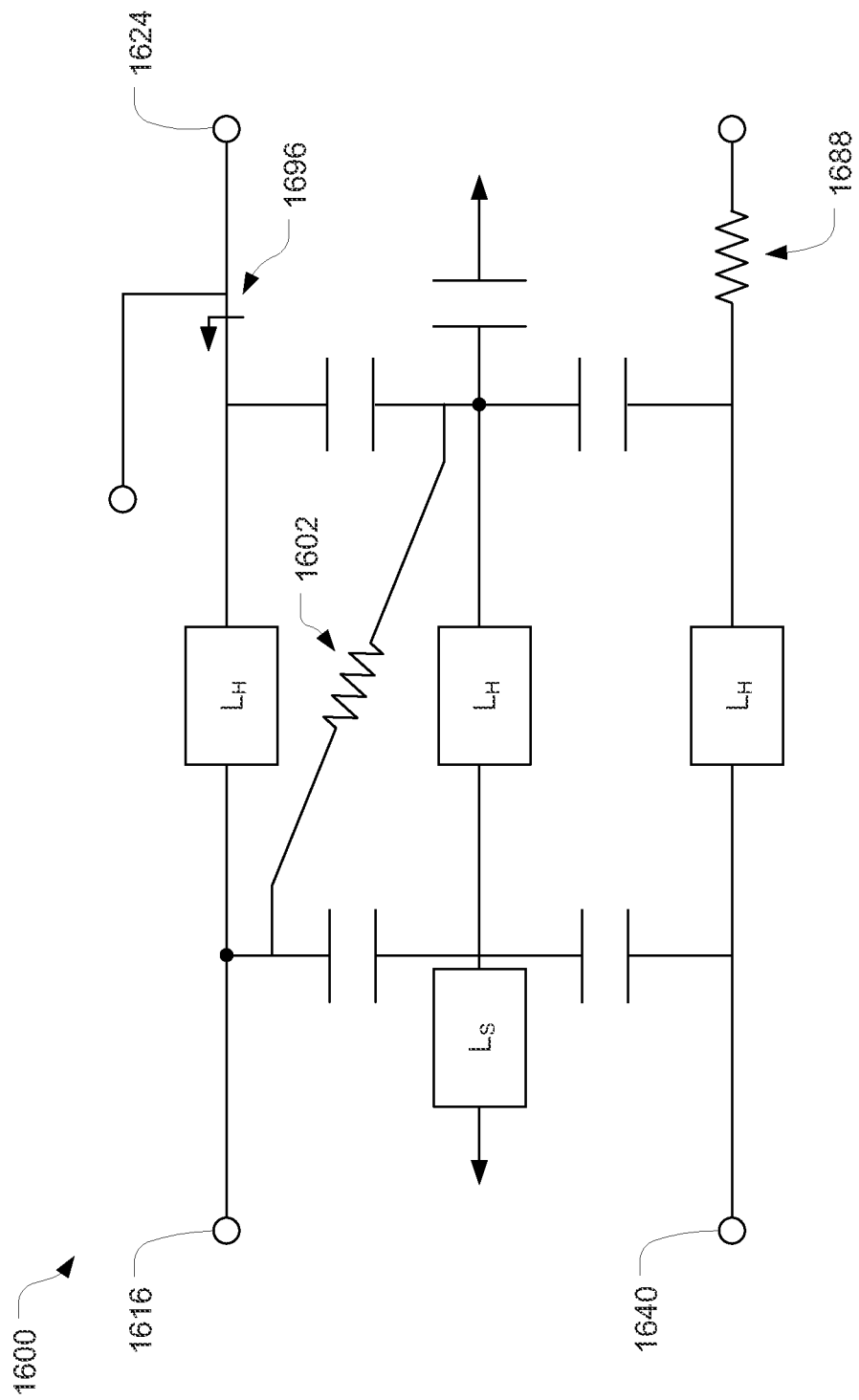
FIG. 16 illustrates a quadrature hybrid circuit in accordance with some embodiments of the present disclosure.

FIG. 16 illustrates a quadrature hybrid circuit 1600 in accordance with some embodiments. The quadrature hybrid circuit 1600, which may be referred to as circuit 1600, may be similar to circuit 1200; however, circuit 1600 may include both switch 1602 and switch 1688.

In this embodiment, the circuit 1600 may enter a backoff-power mode having, e.g., an 11 dB backoff, by turning off, for example, unbiasing, power amplifiers coupled with ports 1616 and 1640, closing switch 1602, and opening switch 1688. As described above with respect to FIGS. 12 and 14, this may cause a high impedance at point 1696.

Figure 17:
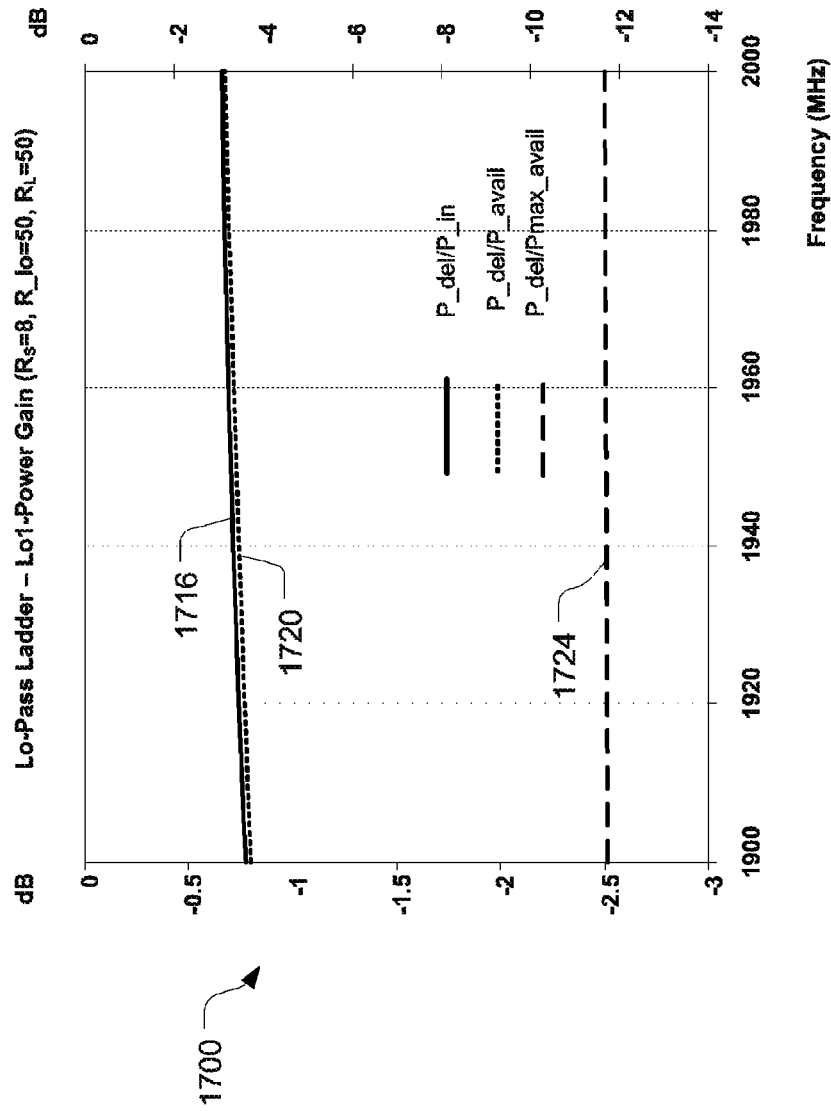
FIG. 17 illustrates a chart that represents various power ratios in accordance with some embodiments of the present disclosure.

FIG. 17 illustrates a chart 1700 that represents various power ratios through circuit 1600 while in a full- and backoff-power mode. The circuit 1600 may have the following parameters: inductors having a Q-factor=30, capacitors having an ESR=0.2 ohms; $R_S$ (on ports 1616 and 1640)=8 ohms; and $R_L$ (on port 1624)=50 ohms.

Line 1716 of chart 1700 represents a ratio of P_del to P_in; line 1720 represents a ratio of P_del to P_avail; and line 1724 represents a ratio of P_del to Pmax_avail. Lines 1716 and 1720 represent insertion losses in full-power mode and may be shown with reference to the left side of chart 1700, while line 1724 represents insertion loss in the backoff-power mode and may be shown with reference to the right side of chart 1700. The highest insertion losses shown in chart 1700 may be −0.64 dB for P_del/P_in; −0.67 dB for P_del/P_avail; and −11.64 for P_del/Pmax_avail.

Figure 18:
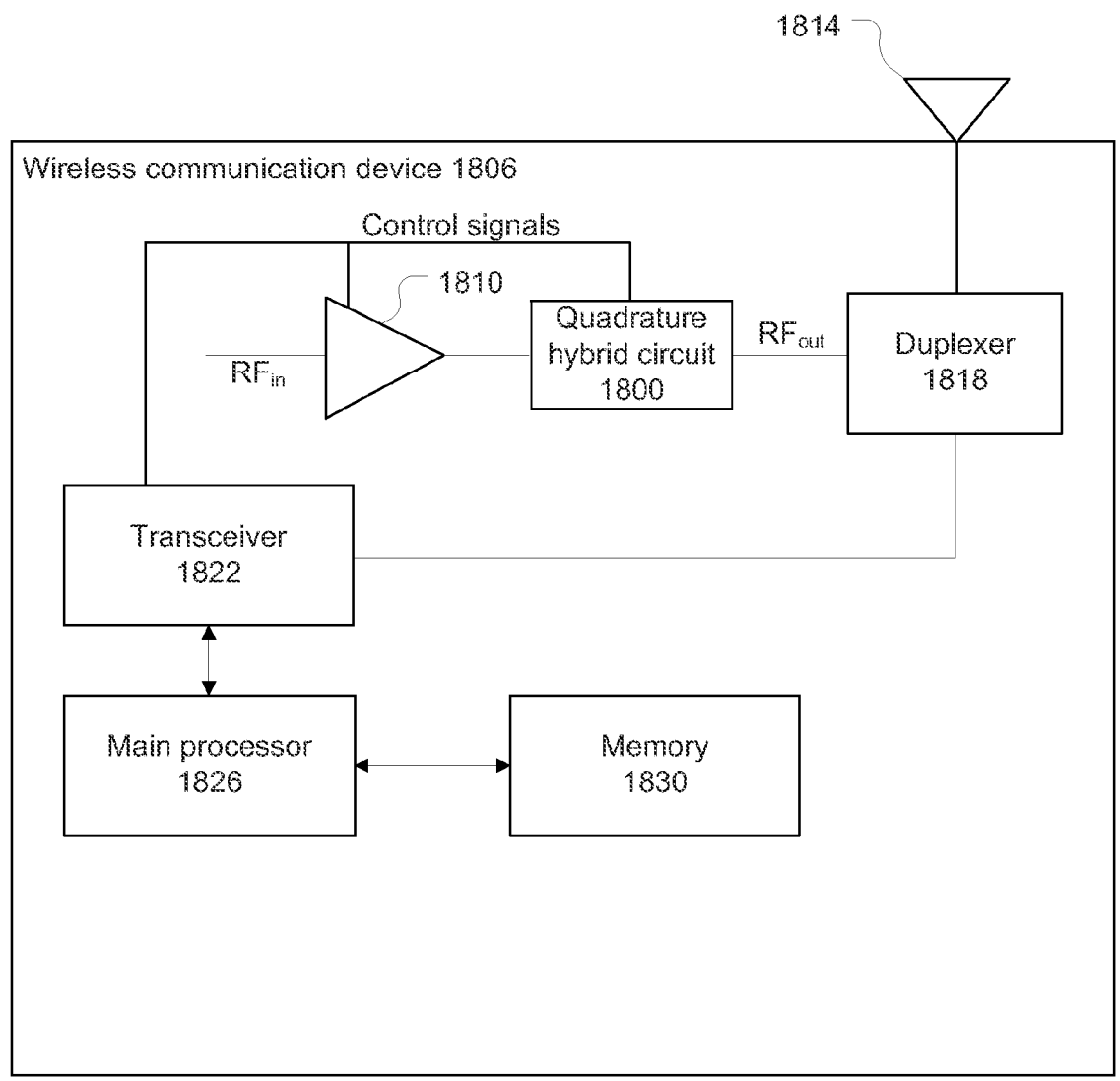
FIG. 18 is a block diagram of an exemplary wireless communication device in accordance with some embodiments of the present disclosure.

A block diagram of an exemplary wireless communication device 1806 incorporating one or more power amplifiers 1810 coupled with a quadrature hybrid circuit 1800, which may be similar to circuits 100, 500, 600, 800, 1000, 1200, 1400, or 1600, is illustrated in FIG. 18 in accordance with some embodiments. In addition to the one or more power amplifiers 1810 and the quadrature hybrid circuit 1800, the wireless communication device 1806 may have an antenna structure 1814, a duplexer 1818, a transceiver 1822, a main processor 1826, and a memory 1830 coupled with each other at least as shown. While the wireless communication device 1806 is shown with transmitting and receiving capabilities, other embodiments may include devices with only transmitting or only receiving capabilities.

In various embodiments, the wireless communication device 1806 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 1826 may execute a basic operating system program, stored in the memory 1830, in order to control the overall operation of the wireless communication device 1806. For example, the main processor 1826 may control the reception of signals and the transmission of signals by transceiver 1822. The main processor 1826 may be capable of executing other processes and programs resident in the memory 1830 and may move data into or out of memory 1830, as desired by an executing process.

The transceiver 1822 may receive outgoing data (e.g., voice data, web data, e-mail, signaling data, etc.) from the main processor 1826, may generate the $RF_{in}$ signal(s) to represent the outgoing data, and provide the $RF_{in}$ signal(s) to the one or more power amplifiers 1810. The transceiver 1822 may also control the one or more power amplifiers 1810 and the quadrature hybrid circuit 1800, with control signals, to operate in either full-power or backoff-power modes.

The one or more amplifiers 1810 may amplify the $RF_{in}$ signal(s) and provide the amplified $RF_{out}$ signal(s) to the quadrature hybrid circuit 1800, which may combine/divide the $RF_{in}$ signal(s) and perform impedance transformations as described hereinabove. The $RF_{in}$ signal(s) may be forwarded to the duplexer 1818 and then to the antenna structure 1814 for an over-the-air (OTA) transmission.

In a similar manner, the transceiver 1822 may receive an incoming OTA signal from the antenna structure 1814 through the duplexer 1818. The transceiver 1822 may process and send the incoming signal to the main processor 1826 for further processing.

In various embodiments, the antenna structure 1814 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 1806 is given by way of example and that, for simplicity and clarity, only so much of the construction and operation of the wireless communication device 1806 as is necessary for an understanding of the embodiments is shown and described. Various embodiments contemplate any suitable component or combination of components performing any suitable tasks in association with wireless communication device 1806, according to particular needs. Moreover, it is understood that the wireless communication device 1806 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:

1. A quadrature hybrid circuit comprising:
a first rung having a first port, a second port, and a first passive electrical component;
a second rung, coupled in parallel with the first rung, and including second, third, and fourth passive electrical components;
a third rung, coupled in parallel with the first and second rungs, and including a third port, a fifth passive electrical component, and a fourth port; and
a plurality of passive electrical components intercoupling the first, second, and third rungs;
wherein:
the quadrature hybrid circuit is configured to transform a source impedance at the first port into a load impedance at the second port, the source and load impedances being different from one another; and
either the second passive electrical component is a capacitor coupled with ground and configured to provide an input reactance, and the fourth passive electrical component is an inductor coupled with ground and configured to provide an output reactance, or the second passive electrical component is an inductor coupled with ground and configured to provide an input reactance, and the fourth passive electrical component is a capacitor coupled with ground and configured to provide an output reactance.

2. The quadrature hybrid circuit of claim 1, wherein the plurality of passive electrical components are either capacitors or inductors and are equal in size.

3. The quadrature hybrid circuit of claim 1, wherein the first, third, and fifth passive electrical components are either capacitors or inductors and are equal in size.

4. The quadrature hybrid circuit of claim 1, wherein a first two passive electrical components of the plurality of passive electrical components are coupled with and between the first and second rungs; and a second two passive electrical components of the plurality of passive electrical components are coupled with and between the second and third rungs.

5. The quadrature hybrid circuit of claim 1, wherein: the first and third ports are configured to receive quadrature input signals; the second port is configured to output a single output signal that is a combination of the quadrature input signals; and the fourth port is configured as an isolation port.

6. The quadrature hybrid circuit of claim 5, wherein the second passive electrical component is a capacitor coupled with ground and configured to provide an input reactance, and the fourth passive electrical component is an inductor coupled with ground and configured to provide an output reactance.

7. (Preivously presented) The quadrature hybrid circuit of claim 5, wherein the second passive electrical component is an inductor coupled with ground and configured to provide an input reactance, and the fourth passive electrical component is a capacitor coupled with ground and configured to provide an output reactance.

8. The quadrature hybrid circuit of claim 5, further comprising:
a match circuit, having a series inductor and a shunt capacitor, coupled with the first rung adjacent the second port.

9. The quadrature hybrid circuit of claim 1, further comprising:
a first switch coupled with the second rung at a first point between the second and third passive electrical components; and
a second switch coupled with the second rung at a second point between the third and fourth passive electrical components;
wherein the quadrature hybrid circuit is configured to open the first and second switches for a first power mode and to close the first and second switches for a second power mode,
wherein the first power mode is associated with a first power and the second power mode is associated with a second power that is less than the first power.

10. The quadrature hybrid circuit of claim 1, wherein the first port is configured to be coupled to a first power amplifier, the third port is configured to be coupled with a second power amplifier, and the quadrature hybrid circuit further comprises:
a fifth port coupled with the first rung at a point between the first passive electrical component and the second port, the fifth port configured to be coupled with a third power amplifier; and
a switch configured to be closed when the quadrature hybrid circuit is operated in a first power mode, with the first and second power amplifiers turned on and the third power amplifier turned off, and opened when the quadrature hybrid circuit is operated in a second power mode with the first and second power amplifiers turned off and the third power amplifier turned on.

11. The quadrature hybrid circuit of claim 10, wherein the switch is on the third rung between the fourth port and the fifth passive electrical component.

12. The quadrature hybrid circuit of claim 10, wherein the switch has a first end coupled with the first rung at a point between the first port and the first passive electrical component and is further coupled with the second rung at a point between the third and fourth passive electrical components.

13. The quadrature hybrid circuit of claim 10, wherein the switch is a first switch on the third rung between the fourth port and the fifth passive electrical component and the quadrature hybrid circuit further comprises:
a second switch that has a first end coupled with the first rung at a point between the first port and the first passive electrical component and is further coupled with the second rung at a point between the third and fourth passive electrical components.

14. A circuit comprising:
four ports; and
a ladder structure coupled with the four ports and having an input reactance at a first midpoint of the ladder structure and an output reactance at a second midpoint,
wherein the ladder structure is a high-pass network or a low-pass network and is configured:
to operate as a quadrature combiner or divider; and
to transform a source impedance at a first port of the four ports into a load impedance at a second port of the four ports, the source impedance being either higher or lower than the load impedance.

15. The circuit of claim 14, wherein the ladder structure is a high-pass network configured to transform a source impedance to a load impedance, wherein the load impedance is higher than the source impedance.

16. The circuit of claim 14, wherein the ladder structure is a high-pass network configured to transform a source impedance to a load impedance, wherein the load impedance is lower than the source impedance.

17. The circuit of claim 14, wherein the ladder structure is a low-pass network configured to transform a source impedance to a load impedance, wherein the load impedance is higher than the source impedance.

18. The circuit of claim 14, wherein the ladder structure is a low-pass network configured to transform a source impedance to a load impedance, wherein the load impedance is lower than the source impedance.

19. The circuit of claim 14, further comprising one or more switches configured to be controlled to set the circuit in a first power mode or a second power mode, wherein the first power mode is associated with a first power and the second power mode is associated with a second power that is less than the first power.

20. A system comprising:
one or more power amplifiers;
a quadrature hybrid circuit coupled with the one or more power amplifiers and having:
four ports; and
a ladder structure coupled with the four ports and having an input reactance at a first midpoint of the ladder structure and an output reactance at a second midpoint, wherein the ladder structure is configured:
to operate as a quadrature combiner or divider; and to transform a source impedance at a first port of the four ports into a load impedance at a second port of the four ports, the source and load impedances being different from one another: and
a transceiver coupled with the one or more power amplifiers and the quadrature hybrid circuit and configured to control the one or more power amplifiers and the quadrature hybrid circuit to be in a first power mode associated with a first power or a second power mode associated with a second power that is less than the first power.

* * * * *